(12) United States Patent
Wang et al.

(10) Patent No.: US 8,932,906 B2
(45) Date of Patent: Jan. 13, 2015

(54) THROUGH SILICON VIA BONDING STRUCTURE

(75) Inventors: Dean Wang, Tainan (TW); Chen-Shien Chen, Zhubei (TW); Kai-Ming Ching, Jhudong Township (TW); Bo-I Lee, Sindian (TW); Chien-Hsiun Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 722 days.

(21) Appl. No.: 12/193,950

(22) Filed: Aug. 19, 2008

(65) Prior Publication Data

US 2010/0047963 A1 Feb. 25, 2010

(51) Int. Cl.
*H01L 21/00* (2006.01)
*H01L 23/00* (2006.01)
*H01L 23/48* (2006.01)
*H01L 21/18* (2006.01)

(52) U.S. Cl.
CPC ..... *H01L 21/187* (2013.01); *H01L 2224/73103* (2013.01); *H01L 2224/16146* (2013.01); *H01L 2224/13* (2013.01); *H01L 24/81* (2013.01); *H01L 2224/81193* (2013.01); *H01L 2224/73204* (2013.01); *H01L 23/481* (2013.01); *H01L 2224/16* (2013.01); *H01L 24/16* (2013.01); *H01L 2224/81* (2013.01); *H01L 2224/13009* (2013.01); *H01L 24/13* (2013.01)
USPC .................. 438/107; 257/E21.499

(58) Field of Classification Search
CPC ........... H01L 2924/00014; H01L 2224/16225; H01L 2224/73204; H01L 2224/94; H01L 25/0657; H01L 2924/00; H01L 2924/0132; H01L 2924/01014; H01L 21/76898; H01L 2225/06513; H01L 2225/06541
USPC .......................................... 438/107, E21.499
See application file for complete search history.

(56) References Cited

U.S. PATENT DOCUMENTS

| | | | |
|---|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |

(Continued)

OTHER PUBLICATIONS

Beyne, E., et al., "3D System Integration Technologies," IEEE, 2007, pp. 1-3.

(Continued)

*Primary Examiner* — Duy T Nguyen
(74) *Attorney, Agent, or Firm* — Slater & Matsil, L.L.P.

(57) ABSTRACT

System and method for bonding semiconductor substrates is presented. A preferred embodiment comprises forming a buffer layer over a surface of a semiconductor substrate while retaining TSVs that protrude from the buffer layer in order to prevent potential voids that might form. A protective layer is formed on another semiconductor substrate that will be bonded to the first semiconductor substrate. The two substrates are aligned and bonded together, with the buffer layer preventing any short circuit contacts to the surface of the original semiconductor substrate.

20 Claims, 3 Drawing Sheets

(56) References Cited

U.S. PATENT DOCUMENTS

| | | | |
|---|---|---|---|
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,344,959 B1 * | 3/2008 | Pogge et al. | 438/459 |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 2003/0180510 A1 * | 9/2003 | Ogawa et al. | 428/209 |
| 2004/0245623 A1 * | 12/2004 | Hara et al. | 257/698 |
| 2005/0212127 A1 * | 9/2005 | Savastiouk et al. | 257/734 |
| 2005/0282374 A1 * | 12/2005 | Hwang et al. | 438/613 |
| 2007/0045836 A1 * | 3/2007 | Kwon et al. | 257/734 |

OTHER PUBLICATIONS

Jourdain, A., et al., "Simultaneous Cu—Cu and Compliant Dielectric Bonding for 3D Stacking of ICs," IEEE, 2007, pp. 207-209.

IMEC Newsletter—Aspire Invent Achieve, vol. 49, Jul. 2007, pp. 1-16.

* cited by examiner

THROUGH SILICON VIA BONDING STRUCTURE

TECHNICAL FIELD

The present invention relates generally to a system and method for bonding semiconductor structures and, more particularly, to a system and method for bonding a semiconductor structure with a through silicon via to another semiconductor structure.

BACKGROUND

FIG. 1 illustrates a method of bonding a first semiconductor structure 101 to a second semiconductor structure 103. The first semiconductor structure 101 comprises through silicon vias 105 that extend from one surface of the first semiconductor structure 101 to the other surface of the first semiconductor structure 101. The second semiconductor structure 103 comprises contact bumps 107 over a under bump metallization (UBM) 109, which provide the electrical contact between the through silicon vias 105 on the first semiconductor structure 101 and the second semiconductor structure 103.

During the bonding process, a no-flow underfill (NFU) 111 is typically placed on the first semiconductor structure 101. Once the NFU 111 is in place, the first semiconductor structure 101 and the second semiconductor structure 103 are brought into contact with the through silicon vias 105 aligned with a corresponding contact bump 107 to establish electrical contact between the first semiconductor structure 101 and the second semiconductor structure 103. After the structures have been aligned and are in contact, a reflow is typically performed to reflow the contact bumps 107 and form a better contact with the through silicon vias 105.

However, if a NFU 111 is used, the surface of the first semiconductor structure 101 may be exposed adjacent to the through silicon vias 105. When this occurs, the material of the contact bump 107 (e.g., solder) may flow into the opening during reflow and establish a short circuit path between the contact bump 107 and the surface of the first semiconductor structure 101 as indicated by reference numeral 113. This can cause defects in the first semiconductor structure 101 and the second semiconductor structure 103, or even total device failure.

Accordingly, what is needed is a method to protect the surface of semiconductor structures from voids that might result in short circuits.

SUMMARY OF THE INVENTION

These and other problems are generally solved or circumvented, and technical advantages are generally achieved, by preferred embodiments of the present invention which join two semiconductor substrates to each other In accordance with a preferred embodiment of the present invention, a semiconductor structure comprises a first substrate and a second substrate. The first substrate comprises a first side and second side opposite the first side, a buffer layer over the second side of the substrate, and a through silicon via extending through the buffer layer. The second substrate comprises a protective layer located between the second substrate and the buffer layer and a contact extending through the protective layer and in contact with the through silicon via.

In accordance with another preferred embodiment of the present invention, a semiconductor structure comprises a first substrate and a second substrate over the first substrate. A buffer layer is located between the first substrate and the second substrate, and a protective layer is located between the buffer layer and the second substrate. A conductor extends through the first substrate and through the buffer layer, and a contact bump is located between the first substrate and the second substrate and in contact with the through silicon via.

In accordance with yet another preferred embodiment of the present invention, a semiconductor structure comprises a first substrate with contact bumps on a first surface of the first substrate. A protective layer is located over the first surface of the first substrate, wherein the contact bumps are substantially exposed by the protective layer, and a buffer layer is located over the protective layer. A second substrate is located over the buffer layer, the second substrate comprising a second surface facing the first substrate and a third surface opposite the second surface, with a through silicon via extending from the third surface to the contact bump.

An advantage of a preferred embodiment of the present invention is a reduced ability of the contact bump to extend through void in the bonding materials and short-circuit to the surface of the substrates. Accordingly, there will be less damage to the overall structure, and an increased yield of usable devices.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely bonding one semiconductor die with a through silicon via to another semiconductor die. The invention may also be applied, however, to other bonding processes.

Figure 1:
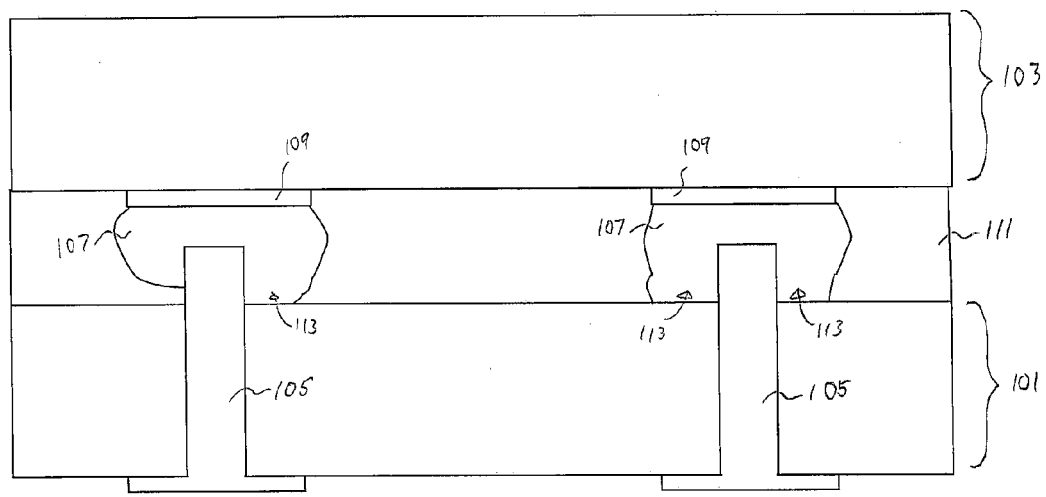
FIG. 1 is an illustration of the bonding of two semiconductor substrates in the prior art.
Figure 2:
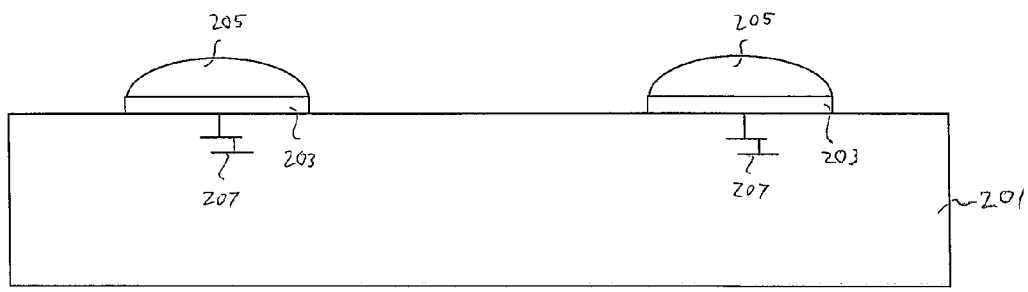
FIGS. 2-6 illustrate the joining of two semiconductor substrates with a through silicon via in accordance with an embodiment of the present invention.

With reference now to FIG. 2, there is shown a first semiconductor substrate 201 with UBMs 203 and contact bumps 205 formed thereon. The first semiconductor substrate 201 is preferably a semiconductor die that includes a substrate having electronic devices formed therein and/or thereon and preferably, but not necessarily, also includes dielectric and conductive layers to provide connectivity and routing between the electronic devices (collectively represented on FIG. 2 by the lines 207). There could be any number of alternating layers of conductive and dielectric layer located on the first semiconductor substrate 201, but a typical range of layers would be from three layers to twelve layers of alternating conductive and dielectric layers.

Alternatively, the first semiconductor substrate 201 may comprise a semiconductor wafer to provide wafer-to-wafer or wafer-to-die bonding. In this embodiment the semiconductor wafer preferably comprises a plurality of semiconductor die, with each die preferably comprising a substrate, active devices formed therein and/or thereon the substrate, and a plurality of dielectric and conductive layers. In this embodiment, the individual semiconductor die have preferably been formed on an single semiconductor wafer, and the individual die have not been singulated from the semiconductor wafer, allowing for a preferred method of processing all of the individual dies at the same time.

On a surface of the first semiconductor substrate 201 are located UBMs 203. The UBMs 203 are preferably connected to corresponding ones of the conductive layers and devices 207 in order to provide electrical connection between the conductive layers and devices and contact bumps 205 formed over the UBMs 203 (further described below). The UBMs 203 are preferably formed of at least three layers of conductive materials, such as a layer of chrome, a layer of a chrome-copper alloy, and a layer of copper, with an optional layer of gold over the top of the copper layer. However, one of ordinary skill in the art will recognize that there are many suitable arrangements of materials and layers, such as an arrangement of titanium/titanium tungsten/copper or an arrangement of copper/nickel/gold, that are suitable for the formation of the UBMs 203. Any suitable materials or layers of material that may be used for the UBMs 203 are fully intended to be included within the scope of the current application.

The UBMs 203 are preferably created by forming each layer conformably over the surface of the first semiconductor substrate 201. The forming of each layer is preferably performed using a CVD process, such as PECVD, although other processes of formation, such as sputtering or evaporation, may alternatively be used depending upon the desired materials. Each of the layers within the UBMs 203 preferably has a thickness of between about 2 µm and about 15 µm. Once the desired layers have been formed, portions of the layers are then removed preferably through a suitable photolithographic masking and etching process to remove the undesired material and to leave patterned UBMs 203.

The contact bumps 205 are preferably formed over the UBMs 203 and preferably comprise a material such as tin, or other suitable materials, such as silver or copper. In an embodiment in which the contact bumps 205 are a tin solder bump, the contact bumps 205 may be formed by initially forming a layer of tin through such commonly used methods such as evaporation, electroplating, printing, solder transfer, ball placement, etc, to a preferred thickness of about 100 µm. Once a layer of tin has been formed on the structure, a reflow is preferably performed in order to shape the material into the desired bump shapes.

Figure 3:
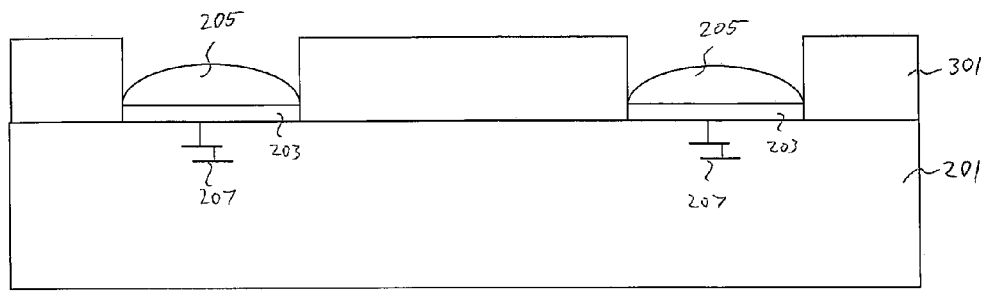

FIG. 3 illustrates the formation and patterning of a protective layer 301 over the surface of the first semiconductor substrate 201. The protective layer 301 is preferably formed of a material such as polyimide (PI), benzocyclobutene (BCB), silicon oxide, silicon nitride, epoxy, combinations of these, or the like. The protective layer 301 is preferably formed through a process such as chemical vapor deposition (CVD), although other suitable processes, such as plasma enhanced chemical vapor deposition (PECVD), or low pressure chemical vapor deposition (LPCVD), may alternatively be used depending upon the specific material used. The protective layer 301 is preferably formed to have a thickness from the surface of the first semiconductor substrate 201 of between about 3 µm and about 20 µm, with a preferred thickness of about 10 µm.

Preferably, once the protective layer 301 has been formed over the surface of the first semiconductor substrate 201 (and over the contact bumps 205 as well), the protective layer 301 is patterned so as to expose the contact bumps 205. The patterning is preferably performed through a suitable photolithographic process, whereby a photoresist (not shown) is formed, exposed, and developed to expose some sections of the protective layer 301 while protecting other sections. An etching process, such as a reactive ion etch (RIE), is then preferably performed to remove the exposed portion of the protective layer 301 and to substantially expose the contact bumps 205. However, while the recited method is the preferred method to pattern the protective layer 301, other suitable methods, such as a photolithographically formed hard mask, may alternatively be used, and all suitable methods for patterning the protective layer 301 are fully intended to within the scope of the present invention.

Figure 4:
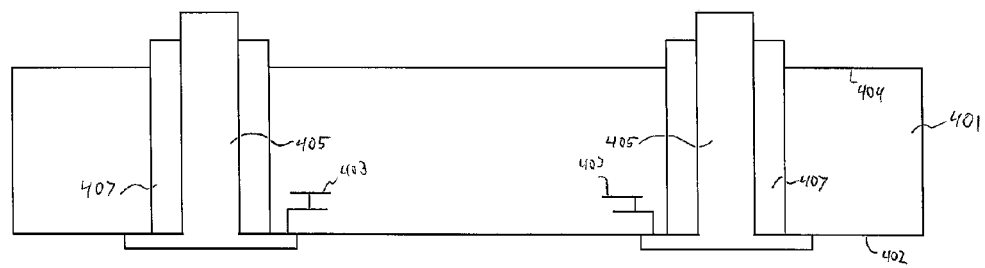

FIG. 4 illustrates a second semiconductor substrate 401 which will eventually be bonded to the first semiconductor substrate 201 (described below with reference to FIG. 6). The second semiconductor substrate 401 is similar to the first semiconductor substrate 201 in that it may be a semiconductor die or a semiconductor wafer, and preferably also has active devices and alternating dielectric and conductive layers for routing and connectivity (collectively represented on FIG. 4 as lines 403) formed therein or thereon. The active devices and alternating dielectric and conductive layers 403 are preferably located on a first side 402 of the second semiconductor substrate 401, with a second side 404 preferably being free of active devices and dielectric and conductive layers.

Preferably, the second semiconductor substrate 401 also comprises one or more TSVs 405. The TSVs 405 may be formed by etching a via partially through the second semiconductor substrate 401 and a liner 407, such as a barrier layer, is preferably formed in the via of a dielectric such as an oxide, nitride, or the like. A conductive material is preferably deposited into the via, after which the second side 404 of the substrate may be thinned to expose the TSVs 405 on the second side 404 of the second semiconductor substrate 401. Preferably, after exposing the conductive material, the second semiconductor substrate 401 and the liner 407 are at least partially etched on the second side 404 of the second semiconductor substrate 401 without etching the conductive material so that the conductive material at least partially protrudes from the second semiconductor substrate 401 and the liner 407.

In another technique, the TSVs 405 may be formed by etching a via partially through the second semiconductor substrate 401 and depositing a dielectric layer in the via. The second side 404 of the second semiconductor substrate 401 is then preferably thinned with the dielectric layer in the via. After the second side 404 has been thinned, the dielectric remaining within the via is removed, and a conductive material, with or without a liner 407, is re-deposited within the via.

The TSVs 405 may be filled with a conductive material such as Al, Cu, other metals, alloys, doped polysilicon, combinations thereof, and the like. Preferably, the TSVs 405 are filled with metal. The TSVs 405 are preferably connected to at least some of the active devices and alternating dielectric and conductive layers 403 so as to electrically connect the active devices and alternating dielectric and conductive layers 403 to the TSVs 405 and the second side 404 of the second semiconductor substrate 401.

Figure 5:
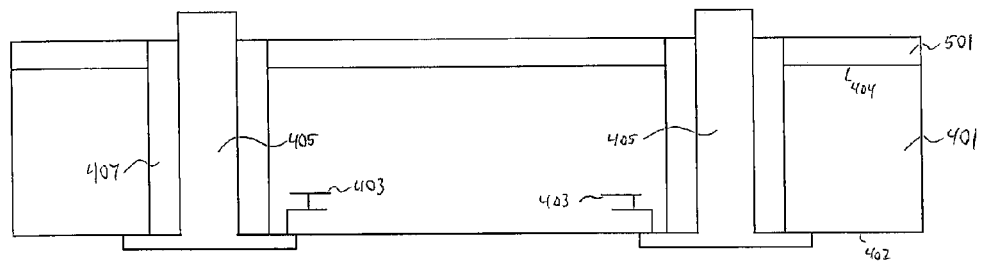

FIG. 5 illustrates the formation of a buffer layer 501 over the second side 404 of the second semiconductor substrate 401. The buffer layer 501, similar to the protective layer 301 on the first semiconductor substrate 201, is preferably formed of a material such as PI, BCB, silicon oxide, silicon nitride, epoxy, combinations of these, or the like. The buffer layer 501 is preferably formed through a process such as spin coating or lamination, although other suitable printing methods may alternatively be used.

Preferably, the buffer layer 501 and the protective layer 301 comprise the same material. Having the same material would increase the adhesion of the buffer layer 501 and the protective layer 301, leading to a stronger bond. However, the buffer layer 501 and the protective layer 301 may alternatively be made from two different materials, or even a combination of materials, as long as the materials are capable of bonding to each other.

Once formed over the second side 404 of the second semiconductor substrate 401, the buffer layer 501 is preferably patterned so that the TSVs 405 protrude from the buffer layer 501 without exposing the second side 404 of the semiconductor substrate. The buffer layer 501 is preferably patterned by a suitable photolithographic mask layer (not shown) and then etched to expose the TSVs 405 such that the TSVs 405 protrude from the buffer layer 501. Preferably, the TSVs 405 protrude from the buffer layer 501 a distance of between about 1 µm and about 20 µm, with a preferred distance of about 10 µm.

By forming the buffer layer 501 over the second side 404 of the second semiconductor substrate 401, the surface of the second semiconductor substrate 401 is preferably isolated from further contact. This isolation prevents any materials such as the material from the contact bump 205 from contacting the second side 404 of the second semiconductor substrate 401 and potentially forming a short circuit that may cause damage.

Figure 6:
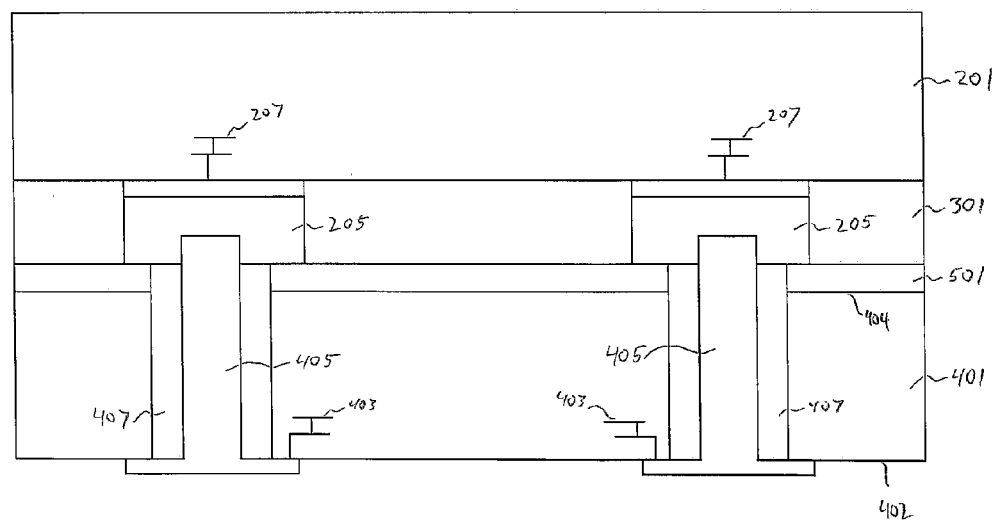

FIG. 6 illustrates the bonding of the first semiconductor substrate 201 to the second semiconductor substrate 401. To bond the first semiconductor substrate 201 to the second semiconductor substrate 401, the substrates are aligned with each other so that the TSVs 405 are aligned with the contact bumps 205, and so that the protective layer 301 and the buffer layer 501 face each other.

Once aligned, the first semiconductor substrate 201 and the second semiconductor substrate 401 are preferably bonded to each other using a process such as thermo-compression bonding, although other processes such as flip-chip bonding or metal diffusion bonding may alternatively be used. While the exact parameters used will be based at least in part on the materials chosen for the protective layer 301 and the buffer layer 501, in a process involving thermo-compression bonding a pressure of less than about 100 MPa, with a preferred pressure of about 30 MPa is preferably used. Additionally, a low temperature bonding, with a temperature of between about 180° C. and about 400° C., and a preferred temperature of about 250° C., is preferably used, although other suitable temperatures may alternatively be used.

After the first semiconductor substrate 201 and the second semiconductor substrate 401 have been bonded together, a reflow is preferably performed to reflow the contact pads 205 in order to enhance the contacts with the TSVs 405. However, with the buffer layer 501 between the material of the contact pads 205, the number of voids that expose the second side 404 of the second semiconductor substrate 401 are greatly reduced, if not eliminated altogether. As such, the damage done from unintentional short-circuit contacts between the contact pads 205 is greatly diminished.

After the thermo-compression bonding, the protective layer 301 and the buffer layer 501 are preferably cured in an oven in order to increase their hardness and resistance to damage. The curing is preferably performed at a temperature of between about 150° C. and about 350° C., with a preferred temperature of about 250° C. Additionally, the curing is preferably performed for a time period of between about 30 minutes and about 4 hours, with a preferred time to cure of about 1 hour.

In another embodiment of the present invention, the protective layer 301 and/or the buffer layer 501 may be partially cured through one or more curing processes prior to the bonding of the first semiconductor substrate 201 to the second semiconductor substrate 401. By partially curing one or both of these layers, the viscosity of the materials used in the protective layer 301 and the buffer layer 501 is lowered, allowing the materials to flow better, and making the bonding process more efficient. Preferably, the materials are cured to between about 70% to about 90% of the total curing, with a preferred partial curing of about 80%. If a partial cure is used prior to bonding, it is preferred that one or more cures are performed after bonding to completely cure the materials.

Although the present invention and its advantages have been described in detail, it should be understood that various changes, substitutions and alterations can be made herein without departing from the spirit and scope of the invention as defined by the appended claims. For example, the first semiconductor substrate and the second semiconductor substrate may be either semiconductor die or else semiconductor wafers.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for connecting two semiconductor wafers, the method comprising:
   providing a first substrate comprising:
      a first side and a second side opposite the first side;
      a through silicon via through the first substrate and protruding from the second side of the first substrate, wherein a first sidewall of the through silicon via comprises a first portion between the first side and the second side and a second portion protruding from the second side of the first substrate to a top of the through silicon via, wherein the first portion and the second portion are aligned with each other;
      a buffer layer on the second side of the first substrate, wherein the through silicon via extends further from the second side of the first substrate than a furthest portion of the buffer layer;
   providing a second substrate with a third side, the second substrate comprising a contact on the third side of the second substrate, wherein the contact is a conductive bump;
   forming a protective layer over the third side of the second substrate such that the contact is substantially exposed;

contacting the buffer layer to the protective layer such that the through silicon via and the contact are aligned with each other; and bonding the first substrate to the second substrate after the forming the protective layer over the third side of the second substrate.

2. The method of claim 1, wherein the bonding the first substrate to the second substrate is performed at least in part through thermo compression bonding.

3. The method of claim 2, wherein the thermo compression bonding is performed at least in part at a temperature of between about 150° C. and about 400° C.

4. The method of claim 1, wherein the buffer layer and the protective layer comprise different materials.

5. The method of claim 1, further comprising:
partially curing the buffer layer and the protective layer prior to contacting the buffer layer to the protective layer; and
fully curing the buffer layer and the protective layer subsequent to bonding the first substrate to the second substrate.

6. The method of claim 5, wherein the partially curing the buffer layer is continued until the buffer layer is between about 70% and about 90% cured.

7. The method of claim 1, further comprising reflowing the contact subsequent to contacting the buffer layer to the protective layer.

8. A method for joining two semiconductor substrates, the method comprising:
providing a first substrate with a first surface and a second surface opposite the first surface;
forming an opening through the first substrate extending between the first surface to the second surface;
forming a conductor in the opening and protruding from the second surface of the first substrate, wherein the conductor has a straight sidewall as it extends from the first surface to a top surface of the conductor;
forming a buffer layer on the second surface of the first substrate, the conductor protruding from the buffer layer;
providing a second substrate with a third surface;
forming a contact bump on the third surface, wherein the contact bump is a conductive bump;
forming a protective layer over the third surface such that the contact bump is substantially exposed;
aligning the contact bump and the conductor after the forming the protective layer over the third surface such that the buffer layer is in contact with the protective layer and the contact bump is in contact with the conductor, wherein at the time of the aligning a portion of the buffer layer immediately adjacent to the second surface of the first substrate remains at least partially uncured; and
bonding the protective layer to the buffer layer after the aligning the contact bump and the conductor.

9. The method of claim 8, further comprising forming a liner in the opening prior to forming the conductor.

10. The method of claim 8, wherein the bonding is performed at least in part through thermo-compression bonding.

11. The method of claim 10, wherein the thermo compression bonding is performed at least in part at a temperature of between about 150° C. and about 400° C.

12. The method of claim 8, further comprising reflowing the contact bump after aligning the contact bump and the conductor.

13. The method of claim 8, further comprising partially curing the buffer layer prior to bonding the protective layer to the buffer layer.

14. The method of claim 13, wherein the buffer layer is partially cured to about 70% to 90% of a full cure.

15. The method of claim 8, wherein the buffer layer comprises either benzocyclobutene or polyimide.

16. A method for attaching two semiconductor substrates, the method comprising:
providing a first substrate and a second substrate, the first substrate comprising a through silicon via extending from a first side and protruding from a second side opposite the first side, the second substrate comprising a contact on a third side, wherein the through silicon via has a straight sidewall as it extends from the first side to a top surface of the through silicon via wherein the contact is a conductive bump;
forming a protective layer over the third side of the second substrate such that the contact is substantially exposed;
forming a buffer layer on the second side of the first substrate, the through silicon via protruding from the second side further than a portion of the buffer layer that is furthest from the second side;
contacting the buffer layer with the protective layer and the through silicon via with the contact;
bonding the buffer layer to the protective layer after the forming the protective layer over the third side of the second substrate; and
reflowing the contact over the through silicon via.

17. The method of claim 16, wherein the bonding the buffer layer to the protective layer is performed at least in part through thermo-compression bonding.

18. The method of claim 17, wherein the thermo compression bonding is performed at least in part at a temperature of between about 150° C. and about 400° C.

19. The method of claim 16, further comprising partially curing the protective layer prior to contacting the buffer layer with the protective layer.

20. The method of claim 19, wherein the partially curing the protective layer is continued until the protective layer is at least 70% cured.

* * * * *